(12) United States Patent  (10) Patent No.: US 7,247,943 B2
Scheucher  (45) Date of Patent: Jul. 24, 2007

(54) INTEGRATED CIRCUIT WITH AT LEAST ONE BUMP

(75) Inventor: Heimo Scheucher, Langegg (AT)

(73) Assignee: NXP B.V., Eindhoven (NL)

( * ) Notice: Subject to any disclaimer, the term of this patent is extended or adjusted under 35 U.S.C. 154(b) by 240 days.

(21) Appl. No.: 10/534,330

(22) PCT Filed: Oct. 31, 2003

(86) PCT No.: PCT/IB03/04877

§ 371 (c)(1),
(2), (4) Date: May 9, 2005

(87) PCT Pub. No.: WO2004/042818

PCT Pub. Date: May 21, 2004

(65) Prior Publication Data

US 2006/0071240 A1    Apr. 6, 2006

(30) Foreign Application Priority Data

Nov. 8, 2002   (EP) ................... 02102552

(51) Int. Cl.
    H01L 23/48   (2006.01)
    H01L 23/485  (2006.01)
(52) U.S. Cl. .............. 257/734; 257/736; 257/773; 257/774; 257/775; 257/780; 257/781; 257/E23.001; 257/E23.02

(58) Field of Classification Search ........... 257/773, 257/774
See application file for complete search history.

(56) References Cited

U.S. PATENT DOCUMENTS

| 5,719,448 | A | 2/1998 | Ichikawa |
| 5,751,065 | A * | 5/1998 | Chittipeddi et al. ........ 257/758 |
| 5,821,855 | A | 10/1998 | Lewis |
| 6,313,537 | B1 | 11/2001 | Lee et al. |

* cited by examiner

Primary Examiner—David Bruce
Assistant Examiner—Tony Tran
(74) Attorney, Agent, or Firm—Kevin H. Fortin

(57) ABSTRACT

In an integrated circuit (1) having a substrate (3) and having a signal-processing circuit (4) which is produced at a surface (8) of the substrate (3), there is provided on the substrate surface (8) a protective layer (12) that has at least one aperture (13) through which a second contact pad (14) is electrically and mechanically connected to a first contact pad (9), wherein the second contact pad (14) is of a height of at least 15 μm and projects laterally beyond the aperture (13) on all sides and is seated on the protective layer (12) by an overlap zone (z) that is closed on itself like a ring, wherein the overlap zone (z) has a constant width of overlap (w) of between 2 μm and 15 μm, and wherein at least one element of the signal-processing circuit (4), and preferably only one capacitor (5) of the signal-processing circuit (4), is provided opposite the first contact pad (9).

7 Claims, 1 Drawing Sheet

INTEGRATED CIRCUIT WITH AT LEAST ONE BUMP

The invention relates to an integrated circuit, having a substrate and having a signal-processing circuit, which signal-processing circuit is produced in a region of the substrate adjoining a surface of the substrate and has a plurality of circuit elements and at least one first contact pad, wherein the first contact pad has a first boundary face accessible from outside the substrate and a second boundary face opposite from the first boundary face, wherein the first contact pad is intended for the electroconductive connection of a component contact of a circuit component external to the integrated circuit to the signal-processing circuit, and having a protective layer that is electrically insulating and is provided on the surface of the substrate to protect the regions of the integrated circuit covered by said protective layer, wherein for each first contact pad an aperture in the protective layer is provided, and wherein for each first contact pad a surface contact pad (=second contact pad) (bump) is provided that is of a height of at least 15 μm and is intended for direct connection to a component contact and extends through the relevant aperture to the first contact pad and is electroconductively connected to the first contact pad and is seated on the protective layer by an overlap zone that projects laterally beyond the aperture and is closed on itself like a ring.

An integrated circuit of this kind is known from U.S. Pat. No. 5,281,855 A. In this known integrated circuit there are provided two lower contact pads (=first contact pads) and two apertures in the protective layer and two surface contact pads (=second contact pads). The two apertures are each approximately square in area, the side-length being approximately 150 μm. The two surface contact pads are each rectangular in area and have an indentation in one long side. The side-lengths of the rectangular areas are 406 μm and 152 μm, which corresponds to 16 milli-inches and 6 milli-inches. Each indentation has two side lengths, namely approximately 137 μm and approximately 57 μm. From the side-lengths, the area obtained for each aperture is approximately 13,225 μm$^2$ and for each surface contact pad it is 61,712 μm$^2$, less the area of an indentation of approximately 7,810 μm$^2$, i.e. approximately 53,900 μm$^2$. It follows from this that the area of the surface contact pad is more that four times the area of the apertures and that more than three-quarters (¾) of the area of each surface contact pad is formed by the overlap zone, which overlap zone projects beyond the aperture concerned and is seated on the protective layer. An overlap zone as large as this is provided because, under the teaching advanced and described in U.S. Pat. No. 5,291,855 A, it is only by the combination of the protective layer and the respective surface contact pads, which are situated one above the other in the overlap zone, that, in a connecting process for connecting the surface contact pads to connecting wires belonging to a transmission coil, adequate mechanical protection is ensured for the circuit elements that underlie respective first contact pads in the regions of each of the surface contact pads. The circuit elements underlying the first contact pads are transistors, diodes, resistors, parts of memories and the like. The connecting process is preferably a thermal compression bonding process but it may also be some other process such as, say, a soldering process or a welding process.

In the known integrated circuit it is a fact that only approximately a quarter (¼) of the area of a surface contact pad is connected to the relevant first contact pad through the associated aperture and that approximately three quarters (¾) of the area of a surface contact pad is seated on the protective layer and is therefore connected thereto. This means that the connection that exists between the surface contact pad and the first contact pad is substantially better in mechanical terms than that between the surface contact pad and the protective layer. This fact is irrelevant in integrated circuits which, after being connected to, for example, a transmission coil, are placed in a glass or plastic capsule and are thus well protected against mechanical stresses. The situation is different, however, for integrated circuits that are considerably less well protected against external mechanical stresses throughout the whole of their period in operation or working life, such as, say, RF transponders in the form of tags, labels and chip-cards, because the design described above that is familiar from known integrated circuits is often unsuitable for integrated circuits of this kind, the reason being the connection of each surface contact pad to the protective layer and the inadequate capacity this connection has to withstand mechanical loads which, when the known design is used in transponders that are not so well protected mechanically, means that, when there are high mechanical loads, the mechanical connection of relatively small area between each surface contact pad and its associated first contact pad has to withstand relatively high forces, which, however, can easily result in the connection being overloaded and hence to its being adversely affected or even destroyed.

It is an object of the invention to overcome the problems outlined above and to produce an improved integrated circuit.

To achieve the above object, features according to the invention are provided in an integrated circuit according to the invention, thus enabling an integrated circuit according to the invention to be characterized in the manner specified below, namely:

An integrated circuit, having a substrate and a signal-processing circuit, which signal-processing circuit is produced in a region of the substrate adjoining a surface of the substrate and has a plurality of circuit elements and at least one first contact pad, wherein the first contact pad has a first boundary face accessible from outside the substrate and a second boundary face opposite from the first boundary face, wherein the first contact pad is intended for the electroconductive connection of a circuit component external to the integrated circuit to the signal-processing circuit, and having a protective layer that is electrically insulating and is provided on the surface of the substrate to protect the regions of the integrated circuit covered by said protective layer, wherein for each first contact pad an aperture is provided in the protective layer, wherein for each first contact pad a second contact pad is provided that is of a height of at least 15 μm, intended for direct connection to a component contact, that extends through the relevant aperture to the first contact pad and is electroconductively connected to the first contact pad, and that is seated on the protective layer by an overlap zone that projects laterally beyond the aperture and is closed on itself like a ring, wherein, along the whole of its ring-like extent, the overlap zone projects beyond the aperture laterally by substantially the same width of overlap and the width of overlap is in a range of between 2 μm and 15 μm and at least one element of the signal-processing circuit is provided opposite the second boundary face of the first contact pad.

What is achieved in an easy way by the provision of the features according to the invention is that, apart from an only narrow overlap zone, which is required and is therefore provided for reasons of protection against unwanted etching of a given lower contact pad (=first contact pad) when the associated surface contact pad (=second contact pad) is being produced, the planar shape and the area of a surface contact pad (=second contact pad) are almost the same as the planar shape and area of the associated surface contact pad and a very strong, robust and durable mechanical connection able to withstand high mechanical loads is obtained. Another very important advantage is that an integrated circuit according to the invention can be manufactured by integration processes that are already known and that no new equipment is therefore required in an existing wafer factory to enable an integrated circuit according to the invention to be produced. As was found in test studies made in the course of development of the integrated circuit according to the invention, sufficiently good protection is provided by means of each surface contact pad and the lower contact pad situated beneath it for the at least one element, situated beneath the first contact pad, of the signal-processing circuit, even though only a small overlap zone is provided in an integrated circuit according to the invention, the reason being that a high protective action is obtained firstly as a result of the relatively considerable height of the surface contact pad and secondly as a result of the interconnections that are provided in any integrated circuit and are formed by at least one metal layer. Another very great advantage is that test pads can be produced that take up only a very small area, i.e. with no substantial loss of IC area, and that in this case at least parts of test circuits, protective circuits and driver circuits can be provided below the test pads, which means that testing time-spans that are shorter than those currently achievable can be achieved, which affords considerable savings of time in a wafer test. After a wafer test of this kind has been performed, test pads of this kind and also other pads which are then no longer needed can be electrically isolated from the integrated circuit by cutting so-called saw loops. What is achieved by the isolation of the test pads and other pads that are no longer needed is firstly that no short-circuits can occur as a result of inaccuracies of positioning when the finished ICs are being used and that with so-called mother modules entire product families can very easily be processed in one highly-optimized module, the reason for this being that the connections are in the same positions on all the ICs belonging to one product family, secondly that the speed of fitting in production can be considerably increased as compared with current facilities and costs can be reduced in this way, and thirdly that a high level of security is achieved because access to the internal parts of a signal-processing circuit is prevented due to the fact that the only items that still provide an electroconductive connection to the signal-processing circuit in the interior of the ICs are the surface contact pads formed in accordance with the invention.

In an integrated circuit, there may be provided opposite the second boundary face of the first contact pad, i.e. below the first contact pad, a plurality of circuit elements, such as inductors, capacitors, resistors, transistors, diodes, memories and the like, by means of which a multiplicity of signal-processing circuits can be produced, such as audio and video signal-processing circuits, chip-card signal-processing circuits or transponder circuits, but also protective stages, driver stages and test stages for such signal-processing circuits. In an integrated circuit according to the invention, it has proved to be highly advantageous if only a capacitor belonging to the signal-processing circuit is provided opposite the second boundary face of the first contact pad. This is particularly advantageous because a capacitor of this kind can then be made relatively large in area and as a result is at relatively little risk from mechanical stresses, which means that even if relatively high forces are applied to the surface contact pad provided above the lower contact pad, as is the case, for example, in a thermal compression bonding process or a flip-chip connecting process, there is no risk of any damage being done to the capacitor of relatively large area.

In an integrated circuit according to the invention, it has proved to be highly advantageous if the planar shape of the capacitor, which planar shape extends parallel to the surface of the substrate, and the planar shapes of the second contact pad and the aperture, which planar shapes likewise extend parallel to the surface of the substrate, are substantially the same and if the area of the planar shape of the capacitor is at most 10% larger than the area of the planar shape of the second contact pad. In this way, the region situated below a surface contact pad (=second contact pad) and a lower contact pad (=first contact pad) lying one above the other is used in its entirety for the production of the capacitor, while at the same time very good protection is ensured for this capacitor of an optimum large size.

In an integrated circuit according to the invention, it has proved to be particularly advantageous if the capacitor is formed by a multilayer capacitor. This is advantageous because a capacitor of this kind has a very high capacitance per unit length and is very robust mechanically.

In an integrated circuit according to the invention, it has proved to be particularly advantageous if at least one metal layer is provided between the lower contact pad (=first contact pad) and the capacitor to act as a layer providing mechanical protection for the capacitor. A particularly good protective function for the capacitor is obtained in this way.

In an integrated circuit according to the invention, it has also proved to be highly advantageous if the lower contact pad (=first contact pad) comprises at least two metal layers that are connected together electrically and mechanically by electroconductive bridges. This is highly advantageous from the point of view of a protective function for the capacitor situated opposite the first contact pad that is as good as possible.

In an integrated circuit according to the invention, it has proved to be particularly advantageous if the width of overlap is of a nominal value of 7 μm. A configuration of this kind has proved advantageous from the point of view of a good compromise between on the one hand an overlap zone that is sufficiently wide for the purposes of protection against unwanted etching and on the other hand a narrow overlap zone that saves as much space as possible.

These and other aspects of the invention are apparent from and will be elucidated with reference to the embodiments described hereinafter.

IN THE DRAWINGS

Figure 1:
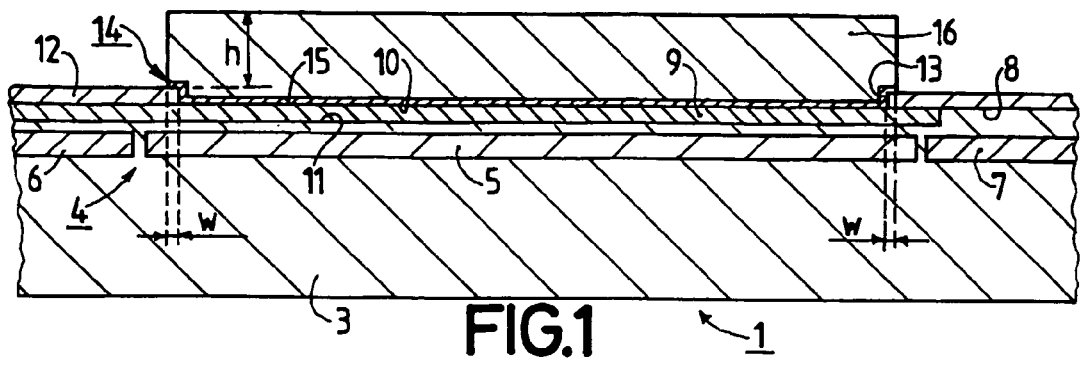
FIG. 1 is a highly diagrammatic sectional view along line I—I in FIG. 2 showing an integrated circuit according to a first embodiment of the invention.
Figure 2:
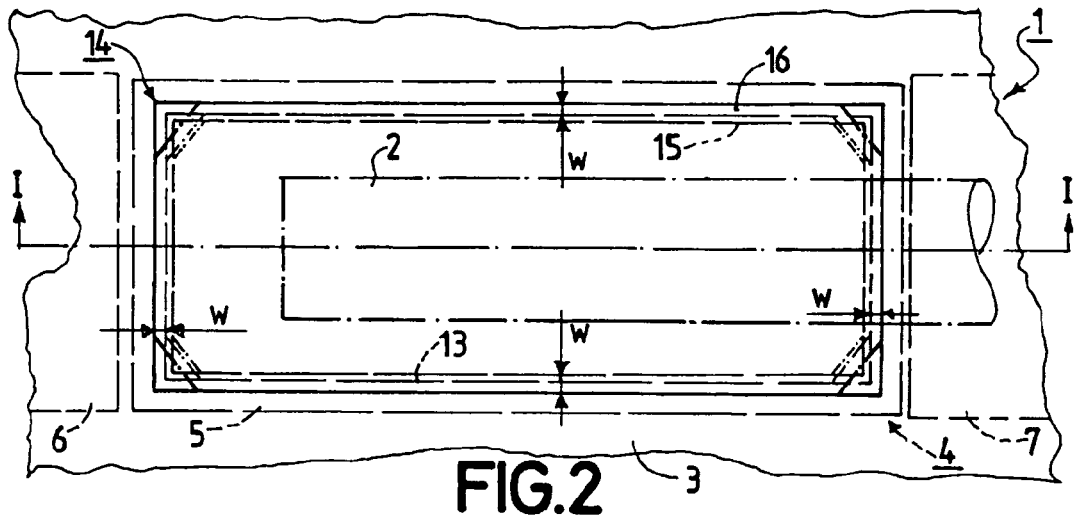
FIG. 2 is a view from above of the integrated circuit shown in FIG. 1.
Figure 3:
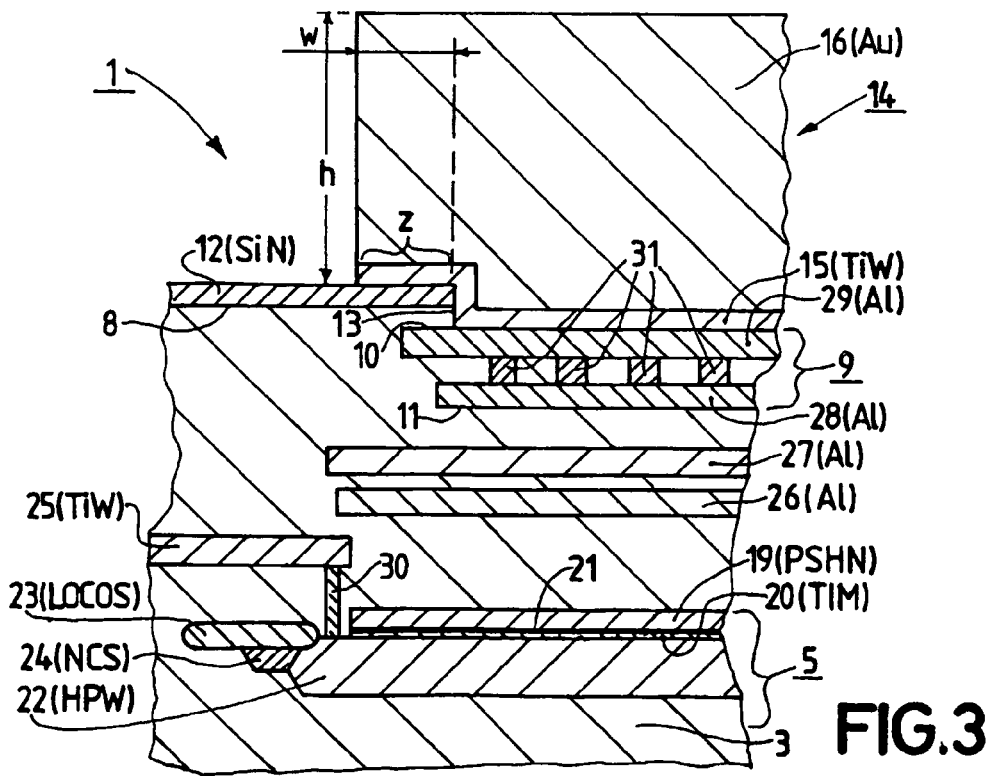
FIG. 3 is a sectional view similar to that in FIG. 1, showing a detail of the integrated circuit shown in FIGS. 1 and 2.

FIGS. 1 to 3 show an integrated circuit 1 that will be referred to below as IC 1 for short. The IC 1 is intended and arranged for use in a transponder, which transponder is not shown in the Figures. The transponder is arranged for non-contacting communication with a communication station suitable for this purpose and comprises essentially the IC 1 and a transmission coil, connected to the IC 1 and intended as a means of transmission operating without physical contact, which transmission coil comprises a plurality of turns of coil and two connecting contacts. The transmission coil forms in this case a circuit component external to the IC 1, with the two coil connecting contacts each forming a component contact. It is assumed that the transmission coil is a transmission coil wound from coil wire whose coil connecting contacts are each formed by one end of the wire. A wire-end 2 of this kind is indicated diagrammatically in FIG. 2 by dotted and dashed lines. The transmission coil may, however, also be produced in other ways, such as, for example, in the form of an etched coil or a printed coil, which coils are provided on a substrate similar to a printed circuit board. The coil connecting contacts may be connected by a thermal compression bonding process or a soldering process or even by a so-called flip-chip technique.

The IC 1 has a substrate 3. Produced in the substrate 3 of the IC 1 is a signal-processing circuit 4, of which signal-processing circuit 4 a first circuit element 5, a second circuit element 6 and a third circuit element 7 are diagrammatically indicated in FIG. 1. The signal-processing circuit 4 is produced in a region of the substrate 3 that adjoins a surface 8 of the substrate 3. The signal-processing circuit 14 has a plurality of circuit elements, of which only the three elements 5, 6 and 7 are indicated in FIG. 1. The signal-processing circuit 4 is, in the present case, a circuit for processing transponder signals, i.e. signals that are transmitted from a communication station to a transponder and are received by the transponder, and signals that are generated by the transponder and are transmitted by the transponder to a communication station, the communication taking place in both directions without physical contact, for example inductively, capacitively or optically.

In the present case, the signal-processing circuit 4 has two first contact pads 9, of which only one first contact pad 9 is shown in FIGS. 1 to 3. The two first contact pads 9 are intended for the electroconductive connection of the two coil connecting contacts (wire-ends 2) of the transmission coil external to the IC 1 to the signal-processing circuit 4. The two first contact pads 9 comprise aluminum (Al). Each first contact pad 9 has a first boundary face 10 accessible from outside the substrate 3 and a second boundary face 11 opposite from the first boundary face 10.

The IC 1 is further provided with a protective layer 12, which in the present case comprises silicon nitride (SiN) and has a thickness of approximately 1.5 μm. A protective layer 12 of this kind may, however, also be of two-layer construction and in this case comprises a layer approximately 500 nm thick of a so-called PSG and a layer approximately 1000 nm thick of a nitride, the latter layer being applied to the layer of PSG, thus giving a total thickness of approximately 1.5 μm. A two-layer protective layer 12 of this kind is particularly robust mechanically and thus performs a particularly good protective function. A protective layer 12 of this kind may, however, also comprise a different material, for example of a so-called PSG or a so-called PTEOS or of oxynitrides or other nitrides or of a combination of such materials. A protective layer of this kind may also be of a different thickness, such as, for example, a thickness of 1 μm or a thickness of 2 μm. The protective layer 12 is electrically insulating. The protective layer 12 is provided on the surface 8 of the substrate 3, being so provided to protect those regions of the signal-processing circuit 4 or of the IC 1 that are covered by it. Provided in the protective layer 12 for each first contact pad 9 is an aperture 13, which means that in the present case there are two such apertures 13 provided in the protective layer 12, though only one such aperture 13 is shown in FIGS. 1 to 3.

For each lower contact pad 9, there is provided in the IC 1 a surface contact pad 14, which means that in the present case there are two such surface contact pads 14 provided, though only one such surface contact pad 14 is shown in FIGS. 1 to 3. In the present case, each surface contact pad 14 comprises a base layer 15 that comprises titanium tungsten (TiW) and that has a thickness of approximately 1 μm (but may also have a thickness of 1.5 μm or 2 μm) and a main part 16 that is provided on the base layer 15 and that in the present case comprises gold (Au). The height h to which each surface contact pad 14 rises above the protective layer 12 is in the present case a nominal height of 18 μm. The height may, however, also be one of only 15 μm. The height h may, however, also be selected to be greater than 18 μm and be, for example, 20 μm or 23 μm or 25 μm. Each surface contact pad 14 is intended to be connected directly to a component contact, i.e. to a wire-end 2 in the present case. In this case, the connection between each surface contact pad 14 and an associated wire-end 2 is made by a thermal compression bonding process. Each surface contact pad 14 extends through the relevant aperture 13 to the relevant first contact pad 9, with which first contact pad 9 the surface contact pad 14 has an electroconductive connection.

As can be seen from FIGS. 1 to 3, the surface contact pad 14 is seated on the protective layer 12 by an overlap zone z (see FIG. 3) which projects beyond the aperture 13 laterally on all sides and which is closed on itself like a ring. In this case, the arrangement made in the IC 1 is advantageously such that the overlap zone z projects laterally beyond the aperture 13 on all sides to substantially the same width of overlap w over the whole of its ring-like extent. Only in its four corner regions does the size of the overlap zone z differ from the width of overlap w, which is a logical result of the geometrical conditions. In the present case, the value of the width of overlap w is a nominal figure of 7 μm. In other words, what this means is that the width of overlap w is to be of a desired value of 7 μm, from which desired value there are deviations as a result of the manufacturing processes. The overlap zone z is important because the provision of said overlap zone z prevents any unwanted incipient etching of the first contact pad 9 when the surface contact pad 14 is being produced. It should, however, be stated that the width of overlap w of the overlap zone z need not necessarily be selected to be of a nominal size of 7 μm, but may also be of different sizes as a function of the manufacturing processes employed, in which case it has proved advantageous if the width of overlap w is within a range of between 2 and 15 μm.

As can be seen from FIGS. 1 to 3, opposite the second boundary face 11 of the first contact pad 9 is provided an element of the signal-processing circuit 4, only the first element 5 of the signal-processing circuit 4 being provided opposite the second boundary face 11 of the first contact pad 9 in the present case. The circuit element 5 is a capacitor in the present case. It should, however, be stated that one or more different circuit elements may also be provided opposite the second boundary face 11 of the first contact pad 9 rather than just the one capacitor 5.

In the IC 1, the planar shape of the capacitor 5, which planar shape extends parallel to the surface 8 of the substrate 3, and the planar shapes of the surface contact pad 14 and the aperture 13 are the same, as can be seen from FIG. 2. As can also be seen from FIG. 2, the area of the planar shape of the capacitor 5 is larger than the area of the planar shape of the surface contact pad 14. It has proved useful in this case if the area of the planar shape of the capacitor 5 is at most 10% larger than the area of the planar shape of the surface contact pad 14. The area of the planar shape of the capacitor 5 may, however, also be of the same size as the area of the planar shape of the surface contact pad 14. The area of the planar shape of the capacitor 5 may, however, also be smaller than the area of the planar shape of the surface contact pad 14. The area of each surface contact pad 14 is rectangular and has two side-lengths of 200 μm and 500 μm. Surface contact pads of above-average size of this kind afford the considerable advantage that accuracy of positioning becomes fairly uncritical in production, an advantageous result of which is that a high throughput can be obtained in production.

The area of each surface contact pad 14 may, however, also be rectangular with beveled corner regions, i.e. octagonal in the final analysis, as is indicated in dotted and dashed lines in FIG. 2. Instead of being beveled in the way indicated by the dotted and dashed lines, the corner regions of a rectangular area of each surface contact pad 14 may also be rounded. The areas of the base part 15 and the aperture 13 are then selected to suit the configuration that has been selected for the area of the surface contact pad 14 in the given case, as is indicated in FIG. 2 by broken lines. What is achieved by the provision of the bevels or roundings is that the risk of micro-cracks in regions of the signal-processing circuit 4 that are situated below the given first contact pad 9 at points adjacent to the corner regions is considerably reduced, because the bevels or roundings give a better distribution of pressure, which is particularly important when a thermal compression bonding process is used to connect the wire-end 2 to a surface contact pad 14 because in a thermal compression bonding process of this kind there may be a pressure of more than 500 g in the region of the first contact pad 9. The planar shape in question may also be selected to be oval or dumbbell shaped. Other surface contact pad geometries and ones designed to meet special requirements are also possible, in which case optimization of the given surface contact pad geometry to suit an assembling process may be opted for, which is done by using suitable measuring facilities to determine the bending, pressure and temperature-distribution conditions that occur in an assembling process and, from the results obtained from the measurements, producing an optimum surface contact pad geometry, which can be done inexpensively and at no risk by changing passivating masks and the surface contact pad mask, which means that particularly good protection will then be obtained for the parts of the signal-processing circuit 4 underlying the surface contact pads 14 and pads 9. The area of each surface contact pad 14 may, however, also be square, in which case the side-lengths may be 200 μm or even 90 μm. If the surface contact pads 14 are not intended for connection to coil connecting contacts but for example for connecting in a testing means for testing the IC 1, then the surface contact pads 14 may also be square with a side-length of only 60 μm.

As can be seen from FIG. 3, the capacitor 5 is formed by a multilayer capacitor 5. The capacitor 5 is what is referred to as a high-voltage TIM gate oxide capacitor in HPW. The capacitor 5 has a PSHN layer 19 that is one electrode of the capacitor. The capacitor 5 also has a TIM layer 20 that is a further electrode. Between the PSHN layer 19 and the TIM layer 20 is provided an insulating interlayer 21 that is indicated in FIG. 3 simply by a thicker line. The three layers 19, 20 and 21 form a first sub-capacitor of the multilayer capacitor 5. The capacitor S also has an HPW layer 22 that is a further electrode of the capacitor and that, with the substrate 3, forms a second sub-capacitor of the multilayer capacitor 5. In connection with the capacitor 5, attention should also be drawn to a LOCOS region 23 and an NCS region 24. The LOCOS region 23 and the NCS region 24 are intended to act as edge-protection zones to prevent unwanted electrical breakdowns such as might occur if the potential conditions were unfavorable. The design of the capacitor 5 as described above is a capacitor design that, at least in principle, is known per se and for this reason the design of the capacitor 5 will not be considered in any greater detail here. It should be mentioned that there are also a large number of other designs for a capacitor that could be used in an IC 1 according to the invention.

Regarding the IC 1, it should also be mentioned that there are a total of five metal layers provided in the IC 1, namely a first metal layer 25, a second metal layer 26, a third metal layer 27, a fourth metal layer 28 and a fifth metal layer 29.

The first metal layer 25 comprises titanium tungsten (TiW) and has a thickness of approximately 600 nm. Its thickness may, however, also be 500 nm or 700 nm. The first metal layer 25 is intended for the electroconductive connection of the capacitor 5 to other elements of the signal-processing circuit 4, there being provided between the first metal layer 25 and the capacitor 5 two electroconductive bridges 30 that also comprise aluminum (Al), of which only one bridge 30 of this kind can be seen in FIG. 3.

The second metal layer 26 and the third metal layer 27 comprise aluminum (Al) and have a thickness of approximately 750 nm. Their thickness may, however, also be 700 nm or 800 nm. The two metal layers 26 and 27 are not used for electrical connection purposes in the present case, or in other words, there is no electroconductive connection from the second metal layer 26 and the third metal layer 27 to other circuit elements. The second metal layer 26 and the third metal layer 27 advantageously perform a mechanical protective function for the capacitor 5, doing so when the surface contact pad 14 is being connected to an end 2 of the coil wire by means of a thermal compression bonding process.

The fourth metal layer 28 and the fifth metal layer 29 comprise aluminum (Al), the fourth metal layer 28 having a thickness of approximately 750 nm and the fifth metal layer 29 having a thickness of approximately 1000 nm. The thickness of the fourth metal layer 28 may be between 700 nm and 800 nm. The thickness of the fifth metal layer 29 may be between 900 nm and 1100 nm. In the present case, the fourth metal layer 28 and the fifth metal layer 29 are connected together by a plurality of bridges 31 that also comprise aluminum (Al). The lower contact pad 9 of the IC 1 is produced by means of the fourth metal layer 28 and the fifth metal layer 29 and the bridges 31 situated therebetween.

What is advantageously obtained in the IC 1 shown in FIGS. 1 to 3 is a mechanically very strong mechanical and electrical connection able to withstand relatively high loads between each surface contact pad 14 and the associated lower contact pad 9, there also being ensured at the same time good mechanical protection for the capacitor 5 which is situated below each surface contact pad 14 and its associated lower contact pad 9.

The IC 1 that has been described by reference to FIGS. 1 to 3 is intended for use in a transponder. However, an integrated circuit according to the invention may also be used with advantage in other cases, such as, for example, in integrated circuits for chip cards or remote controls or the like.

The invention claimed is:

1. An integrated circuit, having a substrate and having a signal-processing circuit, which signal-processing circuit is produced in a region of the substrate adjoining a surface of the substrate and has a plurality of circuit elements and at least one first contact pad, wherein the first contact pad has a first boundary face accessible from outside the substrate and a second boundary face opposite from the first boundary face, wherein the first contact pad is intended for the electroconductive connection of a component contact of a circuit component external to the integrated circuit to the signal-processing circuit, and having a protective layer that is electrically insulating and provided on the surface of the substrate to protect the regions of the integrated circuit covered by said protective layer, wherein for each first contact pad an aperture in the protective layer is provided, wherein for each first contact pad a second contact pad is provided that is of a height of at least 15 μm and is intended for direct connection to a component contact and extends through the relevant aperture to the first contact pad and is electroconductively connected to the first contact pad and is seated on the protective layer by an overlap zone that projects laterally beyond the aperture and is closed on itself like a ring, wherein, along the whole of its ring-like extent, the overlap zone projects beyond the aperture laterally by substantially the same width of overlap, wherein the width of overlap is in a range of between 2 μm and 15 μm, and wherein at least one element of the signal-processing circuit is provided opposite the second boundary face of the first contact pad.

2. An integrated circuit as claimed in claim 1, wherein only one capacitor belonging to the signal-processing circuit is provided opposite the second boundary face of the first contact pad.

3. An integrated circuit as claimed in claim 2, wherein the planar shape of the capacitor, which planar shape extends parallel to the surface of the substrates, and the planar shapes of the second contact pad and the aperture, which planar shapes also extend parallel to the surface of the substrates, are substantially the same, and the area of the planar shape of the capacitor is at most 10% larger than the area of the planar shape of the second contact pad.

4. An integrated circuit as claimed in claim 2, wherein the capacitor is formed by a multilayer capacitor.

5. An integrated circuit as claimed in claim 2, wherein at least one metal layer is provided between the first contact pad and the capacitor as a mechanical protective layer for the capacitor.

6. An integrated circuit as claimed in claim 2, wherein the first contact pad comprises at least two metal layers that are connected together electrically and mechanically by electroconductive bridges.

7. An integrated circuit as claimed in claim 1, wherein the width of overlap is of a nominal value of 7 μm.

* * * * *